(12) United States Patent
Hwang

(10) Patent No.: US 8,399,874 B2
(45) Date of Patent: Mar. 19, 2013

(54) VERTICAL NONVOLATILE MEMORY DEVICE INCLUDING A SELECTIVE DIODE

(75) Inventor: Cheol Seong Hwang, Seoul (KR)

(73) Assignee: SNU R&DB Foundation, Seoul (KR)

( * ) Notice: Subject to any disclaimer, the term of this patent is extended or adjusted under 35 U.S.C. 154(b) by 93 days.

(21) Appl. No.: 13/008,007

(22) Filed: Jan. 17, 2011

(65) Prior Publication Data

US 2012/0181498 A1  Jul. 19, 2012

(51) Int. Cl.
*H01L 29/033* (2006.01)
(52) U.S. Cl. ............... 257/2; 257/E45.001; 438/478
(58) Field of Classification Search ....... 257/2, E45.001, 257/E21.09; 438/478
See application file for complete search history.

(56) References Cited

U.S. PATENT DOCUMENTS

| 5,963,472 A * | 10/1999 | Inada et al. ............... 365/175 |
| 2008/0217600 A1 | 9/2008 | Gidon |
| 2010/0202186 A1* | 8/2010 | Sato et al. ............... 365/148 |

FOREIGN PATENT DOCUMENTS

| JP | 2008-181978 | 8/2008 |
| KR | 10-0609527 | 7/2006 |
| KR | 10-2008-0096432 | 10/2008 |

* cited by examiner

*Primary Examiner* — Howard Weiss
*Assistant Examiner* — Steven Rao
(74) *Attorney, Agent, or Firm* — William Park & Associates Ltd.

(57) ABSTRACT

Provided are a vertical nonvolatile memory device and a method for fabricating the vertical nonvolatile memory device. The vertical nonvolatile memory device can be integrated more highly as compared with a nonvolatile memory device of the related art. In addition, since the vertical nonvolatile memory device includes a selective diode, reading errors can be prevented.

9 Claims, 6 Drawing Sheets

VERTICAL NONVOLATILE MEMORY DEVICE INCLUDING A SELECTIVE DIODE

BACKGROUND

The present disclosure relates to a nonvolatile memory device, and more particularly, to a vertical nonvolatile memory device.

Recent development in information communication industry has increased the use of various memory devices. For example, memory devices used in cellular phones and MP3 players are required to be nonvolatile to retain recorded data even when not powered. Data can be electrically stored in and erased from nonvolatile memory devices, and stored data can be retained in the nonvolatile memory devices although the nonvolatile memory devices are not powered. Therefore, the nonvolatile memory devices are used in various fields. However, related-art dynamic random access memories (DRAMs) formed of semiconductor materials are volatile, so that all the stored information is erased from the DRAMs if power is not supplied. Thus, research has been conducted to develop nonvolatile memory devices that can be used instead of DRAMs.

Flash memory devices including electrically isolated floating gates are representative nonvolatile memory devices, and much research has been conducted on the flash memory devices. However, recent research is focused on nonvolatile memory devices such as phase change random access memories (PRAMs) using phase change phenomenon, magnetic random access memories (MRAMs) using magnetic resistance change phenomenon, ferroelectric random access memories (FRAMs) using spontaneous polarization phenomenon of ferroelectric, and resistance random access memories (ReRAM) using resistance or conductivity switching phenomenon of metal oxide thin film. Particularly, since ReRAMs have simple structures and manufacturing processes compared with other nonvolatile memory devices, ReRAMs receive attention.

ReRAMs including cross-bar arrays are advantageous in terms of integration. However, ReRAMs including cross-bar arrays have the possibility of reading errors.

For this reason, research has been conducted on a ReRAM 100 shown in FIG. 1. The ReRAM 100 includes resistance recording devices 110 in which memory devices 140 and selective diodes 130 are connected in series. The resistance recording devices 110 are arranged in rows and columns between crossing electrodes 120 and 150. The memory devices 140 include resistance layers so that information can be recorded in the memory devices 140. In addition, the selective diodes 130 allow forward currents but block most of reverse currents so that reading errors can be prevented.

However, integration of such horizontal devices is limited, and thus research is necessary to develop new devices that can be highly integrated.

SUMMARY

The present disclosure provides a vertical nonvolatile memory device including a selective diode.

The present disclosure provides a simple method for fabricating a vertical nonvolatile memory device including a selective diode.

According to an exemplary embodiment, a vertical nonvolatile memory device including: a substrate; a conductor-insulator horizontal structure disposed on the substrate, the conductor-insulator horizontal structure including horizontal conductive layers extending in one direction and horizontal insulating layers extending in the same direction as that in which the horizontal conductive layers extend, the horizontal conductive layers and the horizontal insulating layers being alternately stacked; a memory layer disposed at a side of the conductor-insulator horizontal structure and formed of a memory material; a complex conductor-insulator structure disposed at a side of the memory layer such that the memory layer is disposed between the conductor-insulator horizontal structure and the complex conductor-insulator structure, the complex conductor-insulator structure including independent conductor-insulator structures and vertical separation films that are alternately arranged on the substrate in the direction in which the horizontal conductive layers extend, each of the independent conductor-insulator structures including independent conductive layers and independent insulating layers that are alternately stacked on the substrate; a selective diode disposed at a side of the complex conductor-insulator structure such that the complex conductor-insulator structure is disposed between the memory layer and the selective diode; and a conductor-insulator vertical structure disposed at a side of the selective diode such that the selective diode is disposed between the complex conductor-insulator structure and the conductor-insulator vertical structure, the conductor-insulator vertical structure including vertical conductive films and vertical insulating films that are disposed on the substrate, the vertical conductive films and the vertical insulating films being alternately arranged in the direction in which the horizontal conductive layers extend.

In The vertical nonvolatile memory device, the number of the horizontal conductive layers of the conductor-insulator horizontal structure is equal to the number of the independent conductive layers of each of the independent conductor-insulator structures, and the number of the independent conductor-insulator structures of the complex conductor-insulator structure is equal to the number of the vertical conductive films of the conductor-insulator vertical structure.

In the vertical nonvolatile memory device, the conductor-insulator horizontal structure is formed by alternately stacking the horizontal conductive layers and the horizontal insulating layers, and each of the independent conductor-insulator structures is formed by alternately stacking the independent conductive layers and the independent insulating layers. And the horizontal conductive layers and the insulating conductive layers that face each other with the memory layer are disposed therebetween have the same thickness, and the horizontal insulating layers and the independent insulating layers that face each other with the memory layer are disposed therebetween have the same thickness.

In the vertical nonvolatile memory device, the independent conductor-insulator structures and the vertical conductive films are arranged to face each other with the selective diode being disposed therebetween, and the independent conductor-insulator structures and the vertical conductive films have the same length in the direction in which the horizontal conductive layers extend, and vertical insulating films and the vertical separation films have the same length in the direction in which the horizontal conductive layers extend.

In the vertical nonvolatile memory device, the selective diode may be a p-n diode.

In the vertical nonvolatile memory device, the selective diode may be a Schottky junction diode comprising: a semiconductor layer formed of a semiconductor material and disposed at the side of the complex conductor-insulator structure in a manner such that the semiconductor layer makes Schottky contact with the independent conductive layers of the complex conductor-insulator structure; and an ohmic contact layer formed of a conductive material and disposed between the semiconductor layer and the conductor-insulator vertical structure, the ohmic contact layer making ohmic contact with the semiconductor layer.

In The vertical nonvolatile memory device, the memory layer is formed of one of a resistance change material having a resistance varying according to an electric signal, a phase change material that varies in phase according to an electric signal, and a ferroelectric material having a remanent polarization varying according to an electric signal.

In the vertical nonvolatile memory device, the memory layer is formed of a transition metal oxide, and the selective diode is formed of a partially reduced transition metal oxide.

The vertical nonvolatile memory device further comprises a protective insulating film disposed at a side of the conductor-insulator vertical structure such that the conductor-insulator vertical structure is disposed between the selective diode and the protective insulating film.

The present disclosure also provides a method for fabricating a vertical nonvolatile memory device, the method comprising: forming conductor-insulator complex layers by alternately depositing one or more conductive layers and one or more insulating layers; etching the conductor-insulator complex layers in a stacked direction thereof to divide the conductor-insulator complex layers into a plurality of conductor-insulator horizontal structures in which horizontal conductive layers and horizontal insulating layers are alternately stacked, the horizontal conductive layers extending in one direction, the horizontal insulating layers extending in the same direction as the horizontal conductive layers; forming a memory layer by filling a memory material in a gap between first and second conductor-insulator horizontal structures, the first conductor-insulator horizontal structure being a center structure of three conductor-insulator horizontal structures of the plurality of conductor-insulator horizontal structures, and the second conductor-insulator horizontal structure being disposed at a side of the first conductor-insulator horizontal structure; forming a p-n junction diode by forming a p-type semiconductor layer and an n-type semiconductor layer between the first conductor-insulator horizontal structure and a third conductor-insulator horizontal structure disposed at the other side of the first conductor-insulator horizontal structure; removing the third conductor-insulator horizontal structure; forming a vertical conductive layer by filling a conductive material in a gap from which the third conductor-insulator horizontal structure is removed; etching the vertical conductive layer and the first conductor-insulator horizontal structure so as to separate the vertical conductive layer into a plurality of vertical conductive films arranged in the direction in which the horizontal conductive layers extend and to separate the first conductor-insulator horizontal structure into a plurality of independent conductor-insulator structures arranged in the direction in which the horizontal conductive layers extend, each of the independent conductor-insulator structures comprising independent conductive layers and independent insulating layers that are alternately stacked on the substrate; and forming vertical insulating films between the vertical conductive films, and vertical separation films between the independent conductor-insulator structures, by filling an insulating material by a gap-filling method in etched parts of the vertical conductive layer and etched parts of the first conductor-insulator horizontal structure.

The present disclosure also provides a method for fabricating a vertical nonvolatile memory device, the method comprising: forming conductor-insulator complex layers by alternately depositing one or more conductive layers and one or more insulating layers on a substrate; etching the conductor-insulator complex layers in a stacked direction thereof to divide the conductor-insulator complex layers into a plurality of conductor-insulator horizontal structures in which horizontal conductive layers and horizontal insulating layers are alternately stacked, the horizontal conductive layers extending in one direction, the horizontal insulating layers extending in the same direction as the horizontal conductive layers; forming a memory layer by filling a memory material in a gap between first and second conductor-insulator horizontal structures, the first conductor-insulator horizontal structure being a center structure of three conductor-insulator horizontal structures of the plurality of conductor-insulator horizontal structures, and the second conductor-insulator horizontal structure being disposed at a side of the first conductor-insulator horizontal structure; forming a p-n junction diode by forming a p-type semiconductor layer and an n-type semiconductor layer between the first conductor-insulator horizontal structure and a third conductor-insulator horizontal structure disposed at the other side of the first conductor-insulator horizontal structure; removing the third conductor-insulator horizontal structure; forming a vertical insulating layer by filling an insulating material in a gap from which the third conductor-insulator horizontal structure is removed; etching the vertical insulating layer to divide the vertical insulating layer into a plurality of vertical insulating films arranged in the direction in which the horizontal conductive layers extend; etching the first conductor-insulator horizontal structure to separate the first conductor-insulator horizontal structure into a plurality of independent conductor-insulator structures arranged in the direction in which the horizontal conductive layers extend, each of the independent conductor-insulator structures comprising independent conductive layers and independent insulating layers that are alternately stacked on the substrate; forming vertical conductive films between the vertical insulating films by filling a conductive material by a gap-filling method in etched parts of the vertical insulating layer; and forming vertical separation films between the independent conductor-insulator structures by filing an insulating material by a gap-filling method in etched parts of the first conductor-insulator horizontal structure.

The present disclosure also provides a method for fabricating a vertical nonvolatile memory device, the method comprising: forming conductor-insulator complex layers by alternately depositing one or more conductive layers and one or more insulating layers on a substrate; etching the conductor-insulator complex layers in a stacked direction thereof to divide the conductor-insulator complex layers into a plurality of conductor-insulator horizontal structures in which horizontal conductive layers and horizontal insulating layers are alternately stacked, the horizontal conductive layers extending in one direction, the horizontal insulating layers extending in the same direction as the horizontal conductive layers; forming a memory layer by filling a memory material in a gap between first and second conductor-insulator horizontal structures, the first conductor-insulator horizontal structure being a center structure of three conductor-insulator horizontal structures of the plurality of conductor-insulator horizontal structures, and the second conductor-insulator horizontal structure being disposed at a side of the first conductor-insulator horizontal structure; forming a Schottky junction diode between the first conductor-insulator horizontal structure and a third conductor-insulator horizontal structure disposed at the other side of the first conductor-insulator horizontal structure, by forming a semiconductor layer between the first and third conductor-insulator horizontal structures in a manner such that the semiconductor layer makes contact with the first conductor-insulator horizontal structure to form Schottky contact with horizontal conductive layers of the first conductor-insulator horizontal structure, and by forming an ohmic contact layer between the first and third conductor-insulator horizontal structures in a manner such that the ohmic contact layer makes contact with the semiconductor layer and the third conductor-insulator horizontal structure to form ohmic contact with the semiconductor layer; removing the third conductor-insulator horizontal structure; forming a vertical conductive layer by filling a conductive material in a gap from which the third conductor-insulator horizontal structure is removed; etching the vertical conductive layer and the first conductor-insulator horizontal structure so as to separate the vertical conductive layer into a plurality of vertical conductive films arranged in the direction in which the horizontal conductive layers extend and to separate the first conductor-insulator horizontal structure into a plurality of independent conductor-insulator structures arranged in the direction in which the horizontal conductive layers extend, each of the independent conductor-insulator structures comprising independent conductive layers and independent insulating layers that are alternately stacked on the substrate; and forming vertical insulating films between the vertical conductive films, and vertical separation films between the independent conductor-insulator structures, by filling an insulating material by a gap-filling method in etched parts of the vertical conductive layer and etched parts of the first conductor-insulator horizontal structure.

The present disclosure also provides a method for fabricating a vertical nonvolatile memory device, the method comprising: forming conductor-insulator complex layers by alternately depositing one or more conductive layers and one or more insulating layers on a substrate; etching the conductor-insulator complex layers in a stacked direction thereof to divide the conductor-insulator complex layers into a plurality of conductor-insulator horizontal structures in which horizontal conductive layers and horizontal insulating layers are alternately stacked, the horizontal conductive layers extending in one direction, the horizontal insulating layers extending in the same direction as the horizontal conductive layers; forming a memory layer by filling a memory material in a gap between first and second conductor-insulator horizontal structures, the first conductor-insulator horizontal structure being a center structure of three conductor-insulator horizontal structures of the plurality of conductor-insulator horizontal structures, and the second conductor-insulator horizontal structure being disposed at a side of the first conductor-insulator horizontal structure; forming a Schottky junction diode between the first conductor-insulator horizontal structure and a third conductor-insulator horizontal structure disposed at the other side of the first conductor-insulator horizontal structure, by forming a semiconductor layer between the first and third conductor-insulator horizontal structures in a manner such that the semiconductor layer makes contact with the first conductor-insulator horizontal structure to form Schottky contact with horizontal conductive layers of the first conductor-insulator horizontal structure, and by forming an ohmic contact layer between the first and third conductor-insulator horizontal structures in a manner such that the ohmic contact layer makes contact with the semiconductor layer and the third conductor-insulator horizontal structure to form ohmic contact with the semiconductor layer; removing the third conductor-insulator horizontal structure; forming a vertical insulating layer by filling an insulating material in a gap from which the third conductor-insulator horizontal structure is removed; etching the vertical insulating layer to divide the vertical insulating layer into a plurality of vertical insulating films arranged in the direction in which the horizontal conductive layers extend; etching the first conductor-insulator horizontal structure to separate the first conductor-insulator horizontal structure into a plurality of independent conductor-insulator structures arranged in the direction in which the horizontal conductive layers extend, each of the independent conductor-insulator structures comprising independent conductive layers and independent insulating layers that are alternately stacked on the substrate; forming vertical conductive films between the vertical insulating films by filling a conductive material by a gap-filling method in etched parts of the vertical insulating layer; and forming vertical separation films between the independent conductor-insulator structures by filing an insulating material by a gap-filling method in etched parts of the first conductor-insulator horizontal structure.

The present disclosure also provides a method for fabricating a vertical nonvolatile memory device, the method comprising: forming conductor-insulator complex layers by alternately depositing one or more conductive layers and one or more insulating layers on a substrate; etching the conductor-insulator complex layers in a stacked direction thereof to divide the conductor-insulator complex layers into a plurality of conductor-insulator horizontal structures in which horizontal conductive layers and horizontal insulating layers are alternately stacked, the horizontal conductive layers extending in one direction, the horizontal insulating layers extending in the same direction as the horizontal conductive layers; forming a memory layer by filling a memory material in a gap between first and second conductor-insulator horizontal structures, the first conductor-insulator horizontal structure being a center structure of three conductor-insulator horizontal structures of the plurality of conductor-insulator horizontal structures, and the second conductor-insulator horizontal structure being disposed at a side of the first conductor-insulator horizontal structure; forming a diode insulating film by filling an insulating material in a gap between the first conductor-insulator horizontal structure and a third conductor-insulator horizontal structure disposed at the other side of the first conductor-insulator horizontal structure; removing the third conductor-insulator horizontal structure; partially reducing the diode insulating film to from a Schottky junction diode; forming a vertical conductive layer by filling a conductive material in a gap from which the third conductor-insulator horizontal structure is removed; etching the vertical conductive layer and the first conductor-insulator horizontal structure so as to separate the vertical conductive layer into a plurality of vertical conductive films arranged in the direction in which the horizontal conductive layers extend and to separate the first conductor-insulator horizontal structure into a plurality of independent conductor-insulator structures arranged in the direction in which the horizontal conductive layers extend, each of the independent conductor-insulator structures comprising independent conductive layers and independent insulating layers that are alternately stacked on the substrate; and forming vertical insulating films between the vertical conductive films, and vertical separation films between the independent conductor-insulator structures, by filling an insulating material by a gap-tilling method in etched parts of the vertical conductive layer and etched parts of the first conductor-insulator horizontal structure.

The present disclosure also provides a method for fabricating a vertical nonvolatile memory device, the method comprising: forming conductor-insulator complex layers by alternately depositing one or more conductive layers and one or more insulating layers on a substrate; etching the conductor-insulator complex layers in a stacked direction thereof to divide the conductor-insulator complex layers into a plurality of conductor-insulator horizontal structures in which horizontal conductive layers and horizontal insulating layers are alternately stacked, the horizontal conductive layers extending in one direction, the horizontal insulating layers extending in the same direction as the horizontal conductive layers; forming a memory layer by filling a memory material in a gap between first and second conductor-insulator horizontal structures, the first conductor-insulator horizontal structure being a center structure of three conductor-insulator horizontal structures of the plurality of conductor-insulator horizontal structures, and the second conductor-insulator horizontal structure being disposed at a side of the first conductor-insulator horizontal structure; forming a diode insulating film by filling an insulating material in a gap between the first conductor-insulator horizontal structure and a third conductor-insulator horizontal structure disposed at the other side of the first conductor-insulator horizontal structure; removing the third conductor-insulator horizontal structure; partially reducing the diode insulating film to from a Schottky junction diode; forming a vertical insulating layer by filling an insulating material in a gap from which the third conductor-insulator horizontal structure is removed; etching the vertical insulating layer to divide the vertical insulating layer into a plurality of vertical insulating films arranged in the direction in which the horizontal conductive layers extend; etching the first conductor-insulator horizontal structure to separate the first conductor-insulator horizontal structure into a plurality of independent conductor-insulator structures arranged in the direction in which the horizontal conductive layers extend, each of the independent conductor-insulator structures comprising independent conductive layers and independent insulating layers that are alternately stacked on the substrate; forming vertical conductive films between the vertical insulating films by filling a conductive material by a gap-filling method in etched parts of the vertical insulating layer; and forming vertical separation films between the independent conductor-insulator structures by filing an insulating material by a gap-filling method in etched parts of the first conductor-insulator horizontal structure.

In these methods, the etching of the vertical conductive layer and the first conductor-insulator horizontal structure is performed in a manner such that the number of the vertical conductive films is equal to the number of the independent conductor-insulator structures.

In this case, the etching of the vertical conductive layer and the first conductor-insulator horizontal structure is performed in a manner such that the independent conductor-insulator structures face the vertical conductive films with the diode being disposed therebetween.

In these methods, the memory layer is formed of one of a resistance change material having a resistance varying according to an electric signal, a phase change material that varies in phase according to an electric signal, and a ferroelectric material having a remanent polarization varying according to an electric signal.

In these methods, the memory layer and the diode insulating film are formed of a transition metal oxide.

In these methods, the partial reducing of the diode insulating film is performed by heat-treating the diode insulating film under a reducing atmosphere.

These methods, after the forming of the vertical separation Films, further comprise forming a protective insulating film at an outer side of the vertical insulating films and the vertical conductive films by using an insulating material.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, a vertical nonvolatile memory device and a method for fabricating the vertical nonvolatile memory device will be described with reference to the accompanying drawings according to exemplary embodiments. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
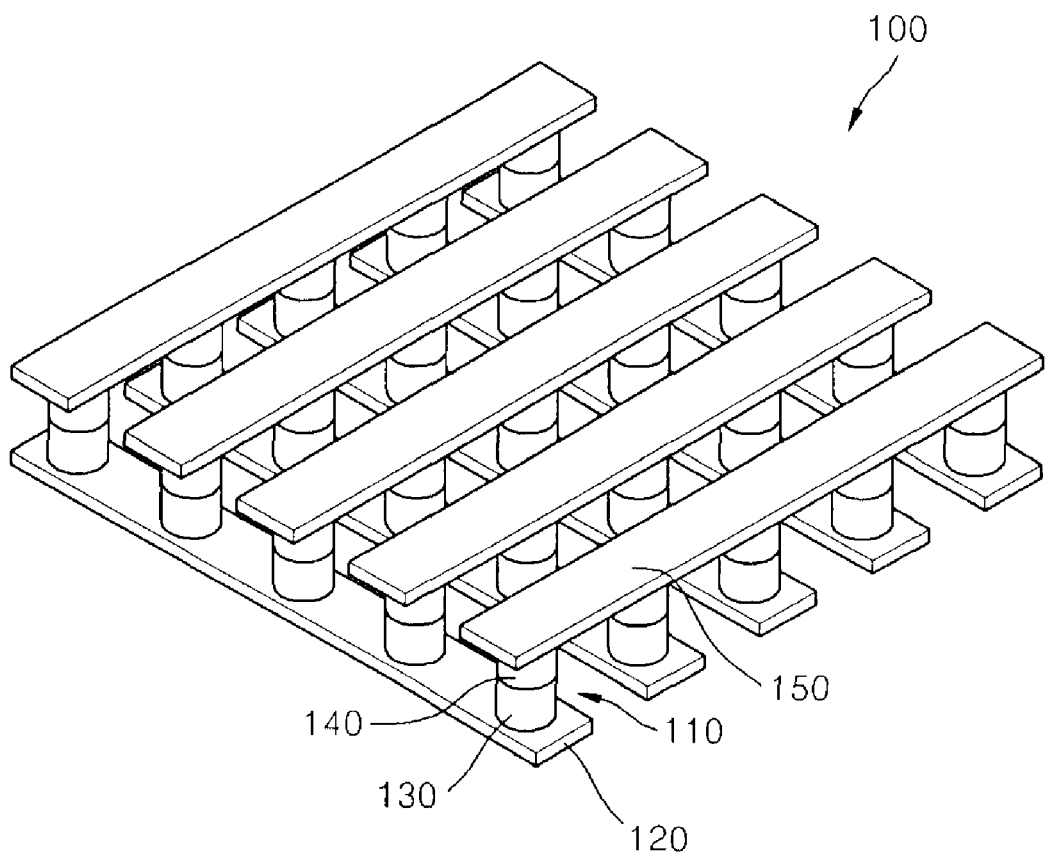
FIG. 1 is a schematic view illustrating the structure of a related-art resistance random access memory (resistance RAM, ReRAM) in which a memory device and a switching diode are connected in series.
Figure 2:
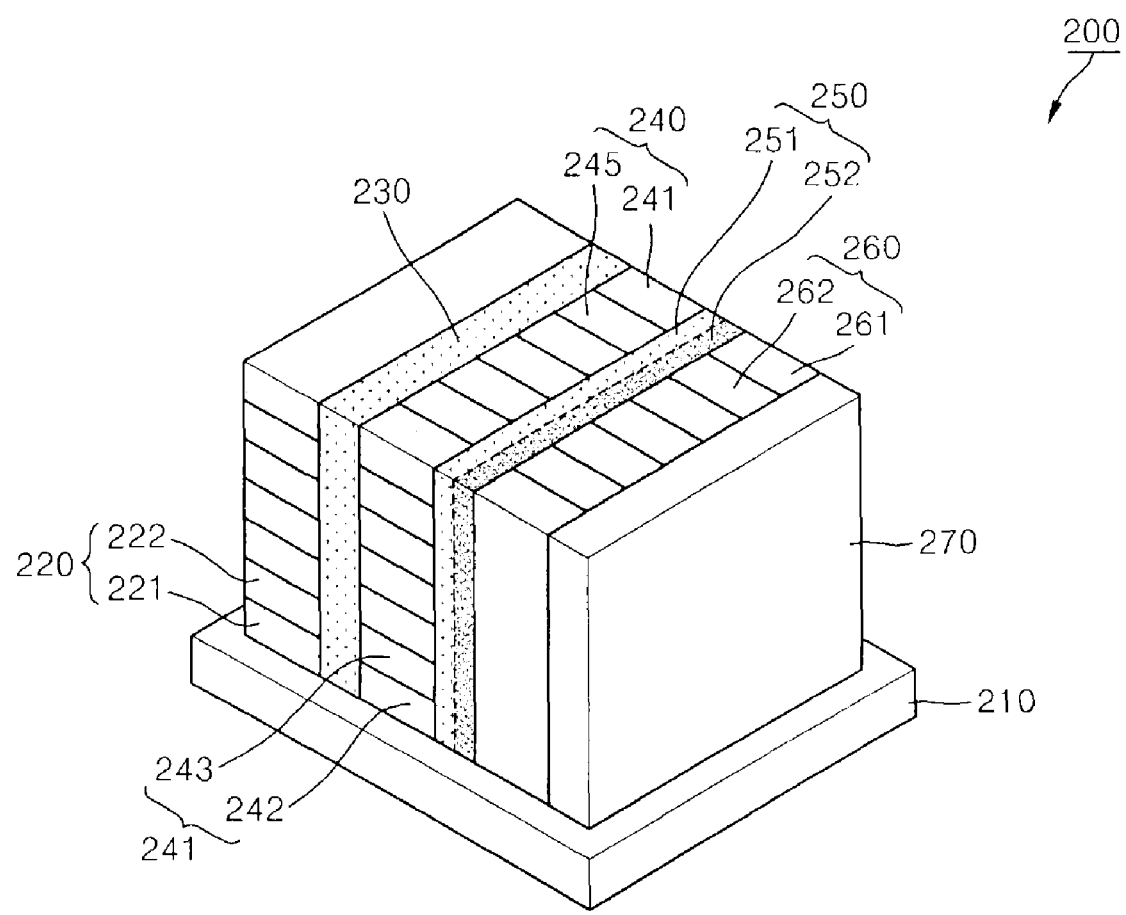
FIG. 2 is a perspective view illustrating a vertical nonvolatile memory device according to an exemplary embodiment.
Figure 3:
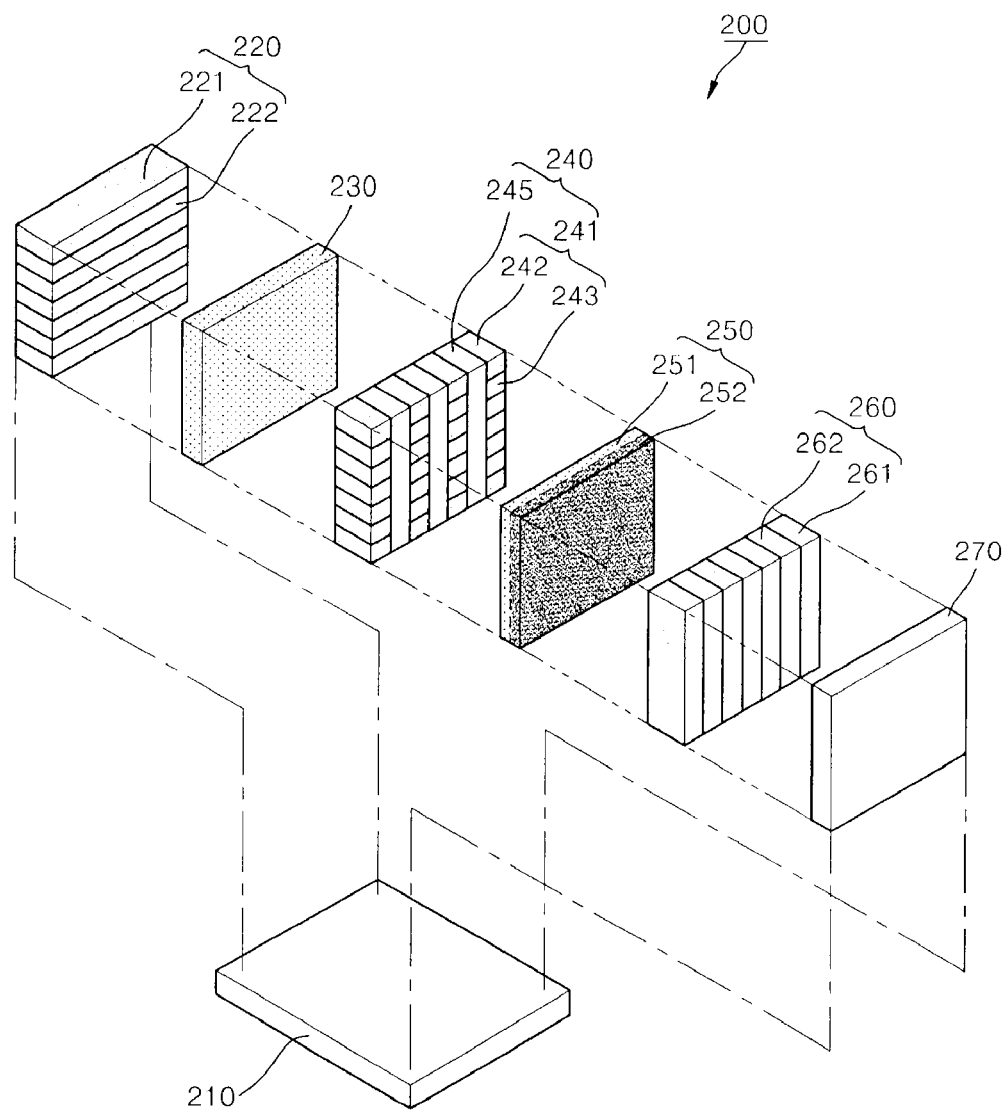
FIG. 3 is an exploded perspective view illustrating the vertical nonvolatile memory device illustrated in FIG. 2.

FIG. 2 is a perspective view illustrating a vertical nonvolatile memory device according to an embodiment, and FIG. 3 is an exploded perspective view illustrating the vertical nonvolatile memory device illustrated in FIG. 2.

Referring to FIGS. 2 and 3, the vertical nonvolatile memory device 200 includes a substrate 210, a conductor-insulator horizontal structure 220, a memory layer 230, a complex conductor-insulator structure 240, a selective diode 250, a conductor-insulator vertical structure 260, and a protective insulating film 270.

The conductor-insulator horizontal structure 220 is formed on the substrate 210 by alternately stacking horizontal conductive layers 221 and horizontal insulating layers 222. The horizontal conductive layers 221 are formed of a conductive material and have an elongated shape in one direction. The horizontal conductive layers 221 may be formed of one of platinum (Pt), iridium (Ir), ruthenium (Ru), gold (Au), osmium (Os), rhenium (Re), and a combination thereof. The horizontal insulating layers 222 are formed of an insulating material and have an elongated shape in the same direction as the horizontal conductive layers 221. The horizontal insulating layers 222 may be formed of a transition metal oxide such as $TiO_2$, $NiO$, $HfO_2$, $Al_2O_3$, $ZrO_2$, $ZnO$, $Ta_2O_5$, and $Nb_2O_5$.

The memory layer 230 is disposed between the conductor-insulator horizontal structure 220 and the complex conductor-insulator structure 240. The memory layer 230 is formed of a memory material. Examples of the memory material that can be used to form the memory layer 230 may include a resistance change material, a phase change material, and a ferroelectric material.

The resistance change material may enter a low-resistance state or high-resistance state in response to a predetermined voltage. Examples of the resistance change material may include: a binary compound transition metal oxide such as $TiO_2$, $NiO$, $HfO_2$, $Al_2O_3$, $ZrO_2$, $ZnO$, $Ta_2O_5$, and $Nb_2O_5$; a ternary compound transition metal oxide such as $SrTiO_3$, $HfAlO$, $HfSiO$, and $HfTiO$; and a combination thereof. In addition, examples of the resistance change material may include $SiO_2$ doped with Cu, $SiO_2$ doped with Ag, Ge—Se—Te compound doped with Cu, Ge—Se—Te compound doped with Ag, $CuO_x$-based resistance change material, and a combination thereof.

The phase change material may change into a crystalline structure or an amorphous structure in response to a predetermined current. A chalcogenide-based compound may be used as the phase change material. Examples of the phase-change chalcogenide compound may include: a binary compound, a ternary compound, and a quaternary compound that are composed or two or more of Ge, Te, Sb, In, Se, and Sn; and a material formed by adding Bi to such a compound. For example, the phase change material may be one of $Ge_2Sb_2Te_5$; $Ge_2Sb_2Te_5$ doped with nitrogen, oxygen, $SiO_2$, or $Bi_2O_3$; and a combination thereof.

The ferroelectric material is a material the polarity of the remanent polarization of which can be changed by a predetermined voltage. Examples of the ferroelectric material may include $Pb(Zr,Ti)O_3(PZT)$, $SrBi_2Ta_2O_9(SBT)$, $(Bi,La)_4Ti_3O_{12}(BLT)$, $BiFeO_3(BFO)$, and a combination thereof.

The complex conductor-insulator structure 240 is disposed between the memory layer 230 and the selective diode 250. The complex conductor-insulator structure 240 includes one or more independent conductor-insulator structures 241 and one or more vertical separation films 245. The independent conductor-insulator structures 241 and the vertical separation films 245 are alternately arranged in the same direction as that in which the horizontal conductive layers 221 extend. The independent conductor-insulator structures 241 are formed on the substrate 210 by alternately stacking independent conductive layers 242 and independent insulating layers 243.

The independent conductive layers 242 are formed of a conductive material and are surrounded by the vertical separation films 245, the independent insulating layers 243, the memory layer 230, and the selective diode 250. The independent conductive layers 242 are separated from each other. Like the horizontal conductive layers 221, the independent conductive layers 242 may be formed of one of platinum (Pt), iridium (Ir), ruthenium (Ru), gold (Au), osmium (Os), rhenium (Re), and a combination thereof. For productivity, the independent conductive layers 242 may be formed of the same material as that used to form the horizontal conductive layers 221.

The independent insulating layers 243 are formed of a conductive material and are surrounded by the vertical separation films 245, the independent conductive layers 242, the memory layer 230, and the selective diode 250. The independent insulating layers 243 are separated from each other. Like the horizontal insulating layers 222, the independent insulating layers 243 may be formed of a transition metal oxide such as $TiO_2$, $NiO$, $HfO_2$, $Al_2O_3$, $ZrO_2$, $ZnO$, $Ta_2O_5$, and $Nb_2O_5$. For productivity, the independent insulating layers 243 may be formed of the same material as that used to form the horizontal insulating layers 222.

The independent conductor-insulator structures 241 may be formed in a manner such that the same number of independent conductive layers 242 and the same number of independent insulating layers 243 are formed in all the independent conductor-insulator structures 241. In addition, the independent conductor-insulator structures 241 and the conductor-insulator horizontal structure 220 are formed in a manner such that the number of independent conductive layers 242 included in a given independent conductor-insulator structure 241 is equal to the number of the horizontal conductive layers 221 included in the conductor-insulator horizontal structure 220. In addition, the independent conductor-insulator structures 241 and the conductor-insulator horizontal structure 220 are formed in a manner such that the number of independent insulating layers 243 included in a given independent conductor-insulator structure 241 is equal to the number of the horizontal insulating layers 222 included in the conductor-insulator horizontal structure 220.

In addition, the independent conductor-insulator structures 241 and the conductor-insulator horizontal structure 220 are formed in a manner such that the horizontal conductive layers 221 have the same thickness as that of the independent conductive layers 242 that face the horizontal conductive layers 221 with the memory layer 230 being disposed therebetween. In addition, the independent conductor-insulator structures 241 and the conductor-insulator horizontal structure 220 are formed in a manner such that the horizontal insulating layers 222 have the same thickness as that of the independent insulating layers 243 that face the horizontal insulating layers 222 with the memory layer 230 being disposed therebetween.

In addition, the independent conductor-insulator structures 241 and the conductor-insulator horizontal structure 220 are formed in a manner such that the stacking order of the horizontal conductive layers 221 and the horizontal insulating layers 222 is equal to the stacking order of the independent conductive layers 242 and the independent insulating layers 243. That is, as shown in FIGS. 2 and 3, if the horizontal conductive layers 221 and the horizontal insulating layers 222 of the conductor-insulator horizontal structure 220 are stacked on the substrate 210 in the order of the horizontal conductive layer 221 and the horizontal insulating layer 222, the independent conductive layers 242 and the independent insulating layers 243 of the independent conductor-insulator structures 241 are stacked on the substrate 210 in the order of the independent conductive layer 242 and the independent insulating layer 243. If the conductor-insulator horizontal structure 220 and the complex conductor-insulator structure 240 are formed as described above, information can be exactly recorded with less power, and reading errors can be reduced.

The vertical separation films 245 are formed on the substrate 210 by using an insulating material. Like the horizontal insulating layers 222, the vertical separation films 245 may be formed of a transition metal oxide such as $TiO_2$, $NiO$, $HfO_2$, $Al_2O_3$, $ZrO_2$, $ZnO$, $Ta_2O_5$, and $Nb_2O_5$. For productivity, the vertical separation films 245 may be formed of the same material as that used to form the horizontal insulating layers 222 and the independent insulating layers 243.

The selective diode 250 is disposed between the complex conductor-insulator structure 240 and the conductor-insulator vertical structure 260 to select a desired cell when recording and reading information. The selective diode 250 may be a Schottky junction diode including a semiconductor layer 251 and an ohmic contact layer 252. The semiconductor layer 251 is formed of a semiconductor material. The semiconductor layer 251 is formed at a side of the complex conductor-insulator structure 240 so that the semiconductor layer 251 can make Schottky contact with the independent conductive layers 242 of the complex conductor-insulator structure 240. For this, the semiconductor layer 251 may be formed of an n-type transition metal oxide. The ohmic contact layer 252 is disposed between the semiconductor layer 251 and the conductor-insulator vertical structure 260. The ohmic contact layer 252 is formed of a conductive material to make ohmic contact with the semiconductor layer 251. For this, the ohmic contact layer 252 may include a material having a low work function such as $(In, Sn)_2O_3(ITO)$ or a reduced transition metal oxide. If a transition metal oxide is heat-treated under a reduction atmosphere, many traps may be generated, and thus the transition metal oxide may make ohmic contact with the semiconductor layer 251.

FIGS. 2 and 3 illustrate the case where the selective diode 250 is a Schottky junction diode. However, the present invention is not limited thereto. For example, any other rectification diode may be used as the selective diode 250. For example, the selective diode 250 may be a p-n junction diode.

The conductor-insulator vertical structure 260 is disposed between the selective diode 250 and the protective insulating film 270. The conductor-insulator vertical structure 260 includes one or more vertical conductive films 261 and one or more vertical insulating films 262. The vertical conductive films 261 and the vertical insulating films 262 are alternately arranged in the same direction as that in which the horizontal conductive layers 221 extend. The vertical conductive films 261 are formed on the substrate 210 by using a conductive material. Like the horizontal conductive layers 221, the vertical conductive films 261 may be formed of one of platinum WO, iridium (Ir), ruthenium (Ru), gold (Au), osmium (Os), rhenium (Re), and a combination thereof. For productivity, the vertical conductive films 261 may be formed of the same material as that used to form the independent conductive layers 242 and the horizontal conductive layers 221.

The vertical insulating films 262 are formed on the substrate 210 by using an insulating material. Like the horizontal insulating layers 222, the vertical insulating films 262 may be formed of a transition metal oxide such as $TiO_2$, NiO, $HfO_2$, $Al_2O_3$, $ZrO_2$, ZnO, $Ta_2O_5$, and $Nb_2O_5$. For productivity, the vertical insulating films 262 may be formed of the same material as that used to form the independent insulating layers 243, the vertical separation films 245, and the horizontal insulating layers 222.

The complex conductor-insulator structure 240 and the conductor-insulator vertical structure 260 may be formed in a manner such that the number of the independent conductor-insulator structures 241 included in the complex conductor-insulator structure 240 is equal to the number of the vertical conductive films 261 included in the conductor-insulator vertical structure 260. In addition, the complex conductor-insulator structure 240 and the conductor-insulator vertical structure 260 are formed in a manner such that the number of the vertical separation films 245 included in the complex conductor-insulator structure 240 is equal to the number of the vertical insulating films 262 included in the conductor-insulator vertical structure 260.

In addition, the complex conductor-insulator structure 240 and the conductor-insulator vertical structure 260 are formed in a manner such that: the independent conductor-insulator structures 241 and the vertical conductive films 261 are disposed to face each other with the selective diode 250 being disposed therebetween, and the vertical separation films 245 and the vertical insulating films 262 are disposed to face each other with the selective diode 250 being disposed therebetween. In addition, the complex conductor-insulator structure 240 and the conductor-insulator vertical structure 260 are formed in a manner such that the lengths of the independent conductor-insulator structures 241 and the vertical conductive films 261 are equal in the direction in which the horizontal conductive layers 221 extend. In addition, the complex conductor-insulator structure 240 and the conductor-insulator vertical structure 260 are formed in a manner such that the lengths of the vertical separation films 245 and the vertical insulating films 262 are equal in the direction in which the horizontal conductive layers 221 extend. If the complex conductor-insulator structure 240 and the conductor-insulator vertical structure 260 are formed as described above, information can be exactly recorded with less power, and reading errors can be reduced.

The protective insulating film 270 is formed on the substrate 210 at a side of the conductor-insulator vertical structure 260. The protective insulating film 270 is formed of an insulating material to separate the vertical nonvolatile memory device 200 from other devices. Like the horizontal insulating layers 222, the protective insulating film 270 may be formed of a transition metal oxide such as $TiO_2$, NiO, $HfO_2$, $Al_2O_3$, $ZrO_2$, ZnO, $Ta_2O_5$, and $Nb_2O_5$. For productivity, the protective insulating film 270 may be formed of the same material as that used to form the independent insulating layers 243, the vertical separation film 245, the horizontal insulating layers 222, and the vertical insulating films 262.

As shown in FIGS. 2 and 3, in the vertical nonvolatile memory device 200 of the current embodiment, the horizontal conductive layers 221 of the conductor-insulator horizontal structure 220 may function as word lines (or bit lines), and the vertical conductive films 261 of the conductor-insulator vertical structure 260 may function as bit lines (or word lines). A cell is formed by the memory layer 230, the independent conductive layers 242, and the selective diode 250 that are disposed between the horizontal conductive layer 221 and the vertical conductive film 261. Information is stored in the memory layer 230, a desired cell is selected through the selective diode 250 when recording or reading information.

As shown in FIGS. 2 and 3, the current embodiment provides a vertical nonvolatile memory device including a selective diode. The vertical nonvolatile memory device of the current embodiment can be integrated more highly as compared with a nonvolatile memory device of the related art. In addition, owing to the selective diode, reading errors can be reduced.

Hereinafter, an explanation will be given of a method for fabricating such a vertical nonvolatile memory device having the above-described structure.

Figure 4:
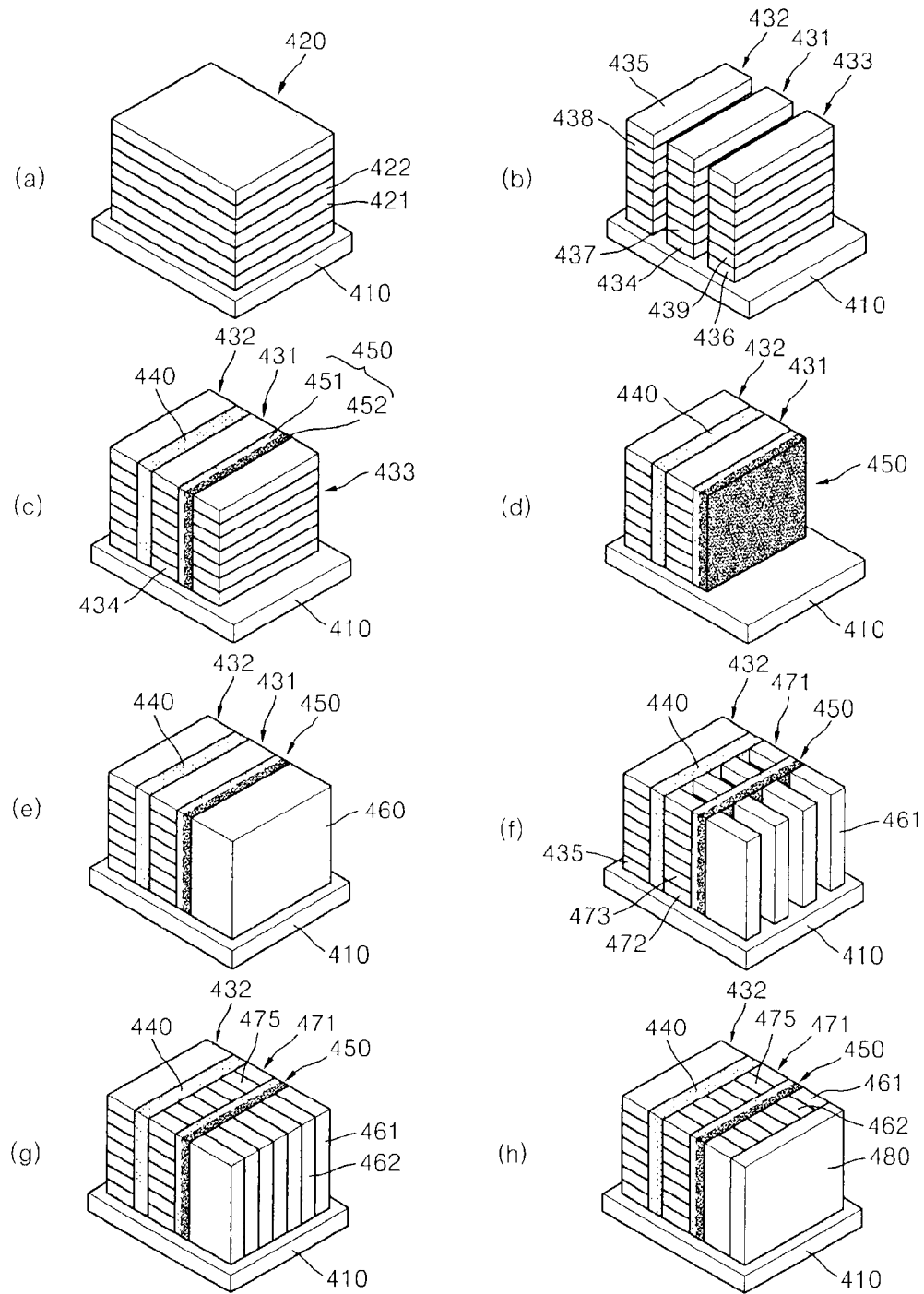
FIG. 4 is a view for explaining a method for fabricating a vertical nonvolatile memory device according to an exemplary embodiment.

FIG. 4 is a view for explaining a method for fabricating a vertical nonvolatile memory device according to an exemplary embodiment.

Referring to FIG. 4(a), first, one or more conductive layers 421 and one or more insulating layers 422 are alternately deposited on a substrate 410 to form conductor-insulator complex layers 420. The conductive layers 421 may be formed of a conductive material such as platinum (Pt), iridium (Ir), ruthenium (Ru), gold (Au), osmium (Os), and rhenium (Re). The insulating layers 422 may be formed of a transition metal oxide such as $TiO_2$, NiO, $HfO_2$, $Al_2O_3$, $ZrO_2$, ZnO, $Ta_2O_5$, and $Nb_2O_5$. The conductor-insulator complex layers 420 may be formed by alternately depositing platinum (Pt) and $TiO_2$. In this case, platinum (Pt) may be deposited by a sputtering method, and $TiO_2$ may be deposited by a sputtering, chemical vapor deposition (CVD), or atomic layer deposition (ALD) method.

Next, the conductor-insulator complex layers 420 are etched in their stacked direction to separate the conductor-insulator complex layers 420 into a plurality of conductor-insulator horizontal structures 431, 432, and 433 as shown in FIG. 4(b). The conductor-insulator complex layers 420 can be easily etched by photolithography and dry etching methods. In the respective conductor-insulator horizontal structures 431, 432, and 433, horizontal conductive layers 434, 435, and 436, and horizontal insulating layers 437, 438, and 439 are alternately stacked in a manner such that the horizontal conductive layers 434, 435, and 436 extend in one direction, and the horizontal insulating layers 437, 438, and 439 extend in the same direction as the horizontal conductive layers 434, 435, and 436. For clarity of description, the conductor-insulator horizontal structure 431 disposed at the center of the three conductor-insulator horizontal structures 431, 432, and 433 shown in FIG. 4(b) will now be referred to as a first conductor-insulator horizontal structure 431; the conductor-insulator horizontal structure 432 disposed at the left of the first conductor-insulator horizontal structure 431 will now be referred to as a second conductor-insulator horizontal structure 432; and the conductor-insulator horizontal structure 433 disposed at the right of the first conductor-insulator horizontal structure 431 will now be referred to as a third conductor-insulator horizontal structure 433.

Next, as shown in FIG. 4(c), a memory material is filled between the first conductor-insulator horizontal structure 431 and the second conductor-insulator horizontal structure 432 to form a memory layer 440. Examples of the memory material used to form the memory layer 440 may include a resistance change material, a phase change material, and a ferroelectric material.

The resistance change material may enter a low-resistance state or high-resistance state in response to a predetermined voltage. Examples of the resistance change material may include: a binary compound transition metal oxide such as $TiO_2$, NiO, $HfO_2$, $Al_2O_3$, $ZrO_2$, ZnO, $Ta_2O_5$, and $Nb_2O_5$; a ternary compound transition metal oxide such as $SrTiO_3$, HfAlO, HfSiO, and HfTiO; and a combination thereof. In addition, examples of the resistance change material may include $SiO_2$ doped with Cu, $SiO_2$ doped with Ag, Ge—Se—Te compound doped with Cu, Ge—Se—Te compound doped with Ag, $CuO_x$-based resistance change material, and a combination thereof.

The phase change material may change into a crystalline structure or an amorphous structure in response to a predetermined current. A chalcogenide-based compound may be used as the phase change material. Examples of the phase-change chalcogenide compound may include: a binary compound, a ternary compound, and a quaternary compound that are composed of two or more of Ge, Te, Sb, In, Se, and Sn; and a material formed by adding Bi to such a compound. For example, the phase change material may be one of $Ge_2Sb_2Te_5$; $Ge_2Sb_2Te_5$ doped with nitrogen, oxygen, $SiO_2$, or $Bi_2O_3$; and a combination thereof.

The ferroelectric material is a material the polarity of the remanent polarization of which can be changed by a predetermined voltage. Examples of the ferroelectric material may include $Pb(Zr,Ti)O_3(PZT)$, $SrBi_2Ta_2O_9(SBT)$, $(Bi,La)_4Ti_3O_{12}(BLT)$, $BiFeO_3(BFO)$, and a combination thereof.

Next, as shown in FIG. 4(c), a Schottky junction diode 450 is formed between the first conductor-insulator horizontal structure 431 and the third conductor-insulator horizontal structure 433. For this, a semiconductor layer 451 is formed on the first conductor-insulator horizontal structure 431 in a manner such that the semiconductor layer 451 makes Schottky contact with the horizontal contact layers 434 of the first conductor-insulator horizontal structure 431. Then, an ohmic contact layer 452 is formed of a conductive material in a manner such that the ohmic contact layer 452 makes contact with the semiconductor layer 451 and the third conductor-insulator horizontal structure 433. The ohmic contact layer 452 makes ohmic contact with the semiconductor layer 451. At this time, the semiconductor layer 451 may be formed by depositing an n-type transition metal oxide on the substrate 410 in a manner such that the n-type transition metal oxide makes contact with the first conductor-insulator horizontal structure 431. Then, the ohmic contact layer 452 may be formed by depositing a material having a low work function such as $(In, Sn)_2O_3(ITO)$ on the substrate 410 in a manner such that the material makes contact with the semiconductor layer 451 and the third conductor-insulator horizontal structure 433.

Next, as shown in FIG. 4(d), the third conductor-insulator horizontal structure 433 is removed. The third conductor-insulator horizontal structure 433 may be easily removed by photolithography and dry etching methods.

Next, as shown in FIG. 4(e), a vertical conductive layer 460 is formed on the position from which the third conductor-insulator horizontal structure 433 is removed. The vertical conductive layer 460 may be formed at the position of the substrate 410 where the third conductor-insulator horizontal structure 433 is removed, by using a conductive material and a gap-filling method. The vertical conductive layer 460 may be formed of a conductive material such as platinum (Pt), iridium (Ir), ruthenium (Ru), gold (Au), osmium (Os), and rhenium (Re). For productivity, the vertical conductive layer 460 may be formed of the same material as that used to deposit the conductive layers 421.

Next, as shown in FIG. 4(f), the vertical conductive layer 460 is etched to divide the vertical conductive layer 460 into a plurality of vertical conductive films 461. That is, the vertical conductive layer 460 is divided by photolithography and dry etching methods into a plurality of vertical conductive films 461 that are arranged at regular intervals in the direction in which the horizontal conductive layers 435 extend. Next, as shown in FIG. 4(f), the first conductor-insulator horizontal structure 431 is etched to separate the first conductor-insulator horizontal structure 431 into a plurality of independent conductor-insulator structures 471. That is, the first conductor-insulator horizontal structure 431 is divided by photolithography and dry etching methods into a plurality of independent conductor-insulator structures 471 that are arranged at regular intervals in the direction in which the horizontal conductive layers 435 extend. The independent conductor-insulator structures 471 have a structure in which independent conductive layers 472 and independent insulating layers 473 are alternately stacked on the substrate 410.

The vertical conductive layer 460 and the first conductor-insulator horizontal structure 431 are etched in a manner such that etched parts of the vertical conductive layer 460 are aligned with etched parts of the first conductor-insulator horizontal structure 431 with the Schottky junction diode 450 being disposed therebetween. In this case, the number of the vertical conductive films 461 can be equal to the number of the independent conductor-insulator structures 471, and the vertical conductive films 461 can be arranged to face the independent conductor-insulator structures 471 with the Schottky junction diode 450 being disposed therebetween.

Next, as shown in FIG. 4(g), an insulating material is filled in the etched parts of the vertical conductive layer 460 by a gap-filling method to form vertical insulating films 462 between the vertical conductive films 461. Next, as shown in FIG. 4(g), an insulating material is filled in the etched parts of the first conductor-insulator horizontal structure 431 by a gap-filling method to form vertical separation films 475 between the independent conductor-insulator structures 471. The vertical insulating films 462 and the vertical separation films 475 may be formed of a transition metal oxide such as $TiO_2$, NiO, $HfO_2$, $Al_2O_3$, $ZrO_2$, ZnO, $Ta_2O_5$, and $Nb_2O_5$. For productivity, the vertical insulating films 462 and the vertical separation films 475 may be formed of the same material as that used to deposit the insulating layers 422.

Next, as shown in FIG. 4(h), outer parts of the vertical conductive films 461 and the vertical insulating films 462 are etched, and an insulating material is filled by a gap-filling method to form a protective insulating film 480 at the etched outer parts of the vertical conductive films 461 and the vertical insulating films 462 for separation from other devices. Like the insulating layers 422, the protective insulating film 480 may be formed of a transition metal oxide such as $TiO_2$, NiO, $HfO_2$, $Al_2O_3$, $ZrO_2$, ZnO, $Ta_2O_5$, and $Nb_2O_5$. For productivity, the protective insulating film 480 may be formed of the same material as that used to deposit the insulating layers 422.

Figure 5:
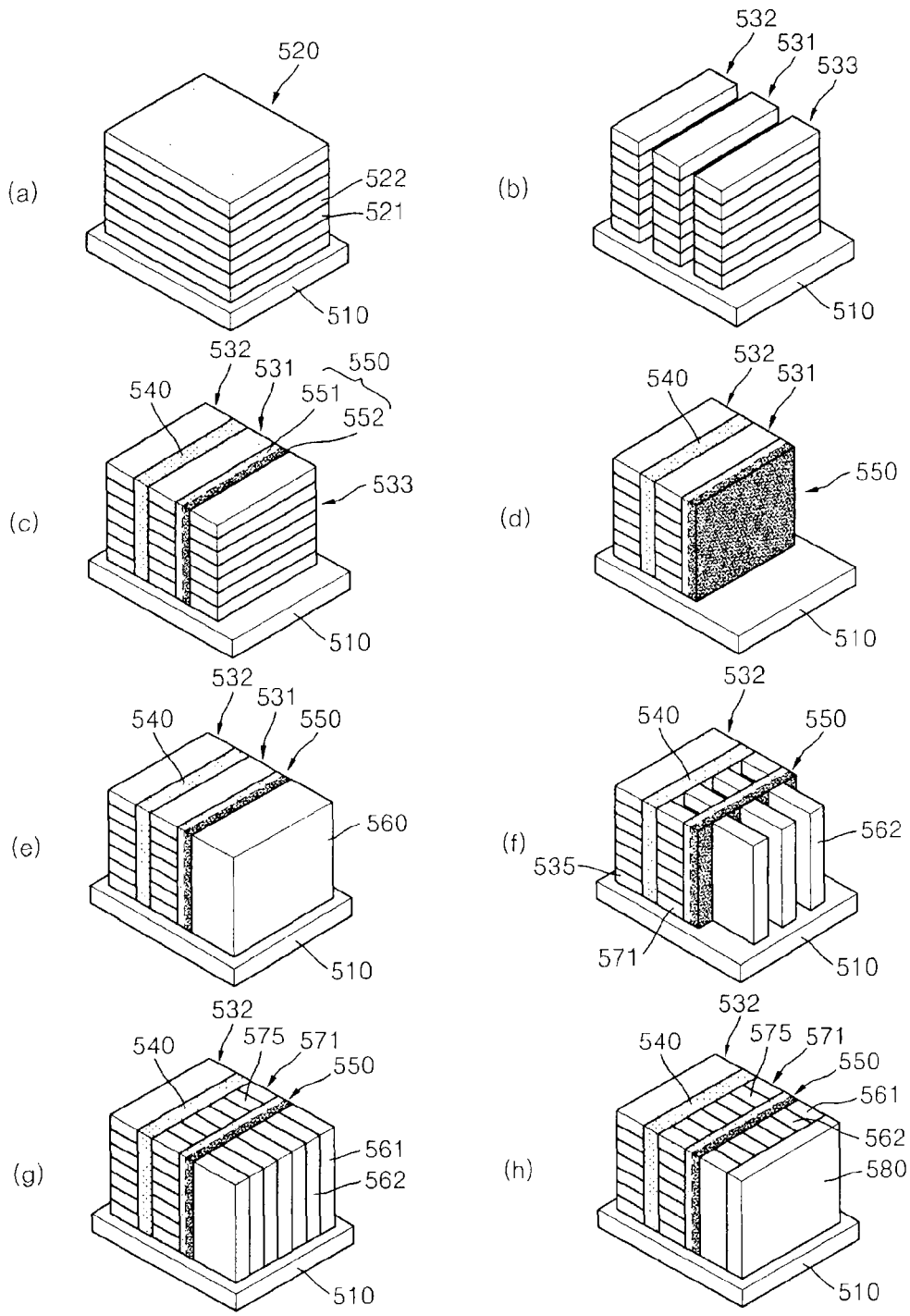
FIG. 5 is a view for explaining a method for fabricating a vertical nonvolatile memory device according to another exemplary embodiment.

FIG. 5 is a view for explaining a method for fabricating a vertical nonvolatile memory device according to another exemplary embodiment.

Referring to FIG. 5(a), first, one or more conductive layers 521 and one or more insulating layers 522 are alternately deposited on a substrate 510 to form conductor-insulator complex layers 520.

Next, the conductor-insulator complex layers 520 are etched in their stacked direction to separate the conductor-insulator complex layers 520 into a plurality of conductor-insulator horizontal structures 531, 532, and 533 as shown in FIG. 5(b). For clarity of description, the conductor-insulator horizontal structure 531 disposed at the center of the three conductor-insulator horizontal structures 531, 532, and 533 shown in FIG. 5(b) will now be referred to as a first conductor-insulator horizontal structure 531; the conductor-insulator horizontal structure 532 disposed at the left of the first conductor-insulator horizontal structure 431 will now be referred to as a second conductor-insulator horizontal structure 532; and the conductor-insulator horizontal structure 533 disposed at the right of the first conductor-insulator horizontal structure 531 will now be referred to as a third conductor-insulator horizontal structure 533.

Next, as shown in FIG. 5(c), a memory material is filled between the first conductor-insulator horizontal structure 531 and the second conductor-insulator horizontal structure 532 to form a memory layer 540. Next, as shown in FIG. 5(c), a Schottky junction diode 550 is formed between the first conductor-insulator horizontal structure 531 and the third conductor-insulator horizontal structure 533.

Next, as shown in FIG. 5(d), the third conductor-insulator horizontal structure 533 is removed.

The processes shown in FIGS. 5(a) through 5(d) are substantially the same as those explained with reference to FIGS. 4(a) through 4(d).

Next, as shown in FIG. 5(e), a vertical insulating layer 560 is formed on the position from which the third conductor-insulator horizontal structure 533 is removed. The vertical insulating layer 560 may be formed at the position of the substrate 510 where the third conductor-insulator horizontal structure 533 is removed, by using an insulating material and a gap-filling method. The vertical insulating layer 560 may be formed of a transition metal oxide such as $TiO_2$, NiO, $HfO_2$, $Al_2O_3$, $ZrO_2$, ZnO, $Ta_2O_5$, and $Nb_2O_5$. For productivity, the vertical insulating layer 560 may be formed of the same material as that used to deposit the insulating layers 522.

Next, as shown in FIG. 5(f), the vertical insulating layer 560 is etched to divide the vertical insulating layer 560 into a plurality of vertical insulating films 562. That is, the vertical insulating layer 560 is divided by photolithography and dry etching methods into a plurality of vertical insulating films 562 that are arranged at regular intervals in the direction in which horizontal conductive layers 535 of the first conductor-insulator horizontal structure 531 are extended. Next, as shown in FIG. 5(f), the first conductor-insulator horizontal structure 531 is etched to separate the first conductor-insulator horizontal structure 531 into a plurality of independent conductor-insulator structures 571. That is, the first conductor-insulator horizontal structure 531 is divided by photolithography and dry etching methods into a plurality of independent conductor-insulator structures 571 that are arranged at regular intervals in the direction in which the horizontal conductive layers 535 extend. The independent conductor-insulator structures 571 have a structure in which independent conductive layers 572 and independent insulating layers 573 are alternately stacked on the substrate 510.

The vertical insulating layer 560 and the first conductor-insulator horizontal structure 531 are etched in a manner such that: etched parts of the vertical insulating layer 560 are aligned with the independent conductor-insulator structures 571 with the Schottky junction diode 550 being disposed therebetween, and etched parts of the first conductor-insulator horizontal structure 531 are aligned with the vertical insulating films 562 with the Schottky junction diode 550 being disposed therebetween. In this case, the number of vertical conductive films 561 (refer to FIG. 5(g)) can be equal to the number of the independent conductor-insulator structures 571, and the vertical conductive films 561 can be arranged to face the independent conductor-insulator structures 571 with the Schottky junction diode 550 being disposed therebetween.

Next, as shown in FIG. 5(g), a conductive material is filled in the etched parts of the vertical insulating layer 560 by a gap-filling method to form the vertical conductive films 561 between the vertical insulating films 562. The vertical conductive films 561 may be formed of a conductive material such as platinum (Pt), iridium (Ir), ruthenium (Ru), gold (Au), osmium (Os), and rhenium (Re). For productivity, the vertical conductive films 561 may be formed of the same material as that used to deposit the conductive layers 521. Next, as shown in FIG. 5(g), an insulating material is filled in the etched parts of the first conductor-insulator horizontal structure 531 by a gap-filling method to form vertical separation films 575 between the independent conductor-insulator structures 571. The vertical separation films 575 may be formed of a transition metal oxide such as $TiO_2$, NiO, $HfO_2$, $Al_2O_3$, $ZrO_2$, ZnO, $Ta_2O_5$, and $Nb_2O_5$. For productivity, the vertical separation films 575 may be formed of the same material as that used to deposit the insulating layers 522.

Next, as shown in FIG. 5(h), outer parts of the vertical conductive films 561 and the vertical insulating films 562 are etched, and an insulating material is filled by a gap-filling method to form a protective insulating film 580 at the etched outer parts of the vertical conductive films 561 and the vertical insulating films 562 for separation from other devices. Like the insulating layers 522, the protective insulating film 580 may be formed of a transition metal oxide such as $TiO_2$, NiO, $HfO_2$, $Al_2O_3$, $ZrO_2$, ZnO, $Ta_2O_5$, and $Nb_2O_5$. For productivity, the protective insulating film 580 may be formed of the same material as that used to deposit the insulating layers 522.

In the methods for fabricating a vertical nonvolatile memory device explained with reference to FIGS. 4 and 5, a Schottky junction diode (450, 550) is formed between the first conductor-insulator horizontal structure (431, 531) and the third conductor-insulator horizontal structure (433, 533) so as to use the Schottky junction diode (450, 550) as a selective diode. In a similar method for fabricating a vertical nonvolatile memory device, a p-n junction diode may be formed between the first conductor-insulator horizontal structure (431, 531) and the third conductor-insulator horizontal structure (433, 533) so as to use the p-n junction diode as a selective diode. That is, a vertical nonvolatile memory device using a p-n junction diode may be fabricated through the same processes except for a process of forming a p-n junction diode instead of a Schottky junction diode.

Figure 6:
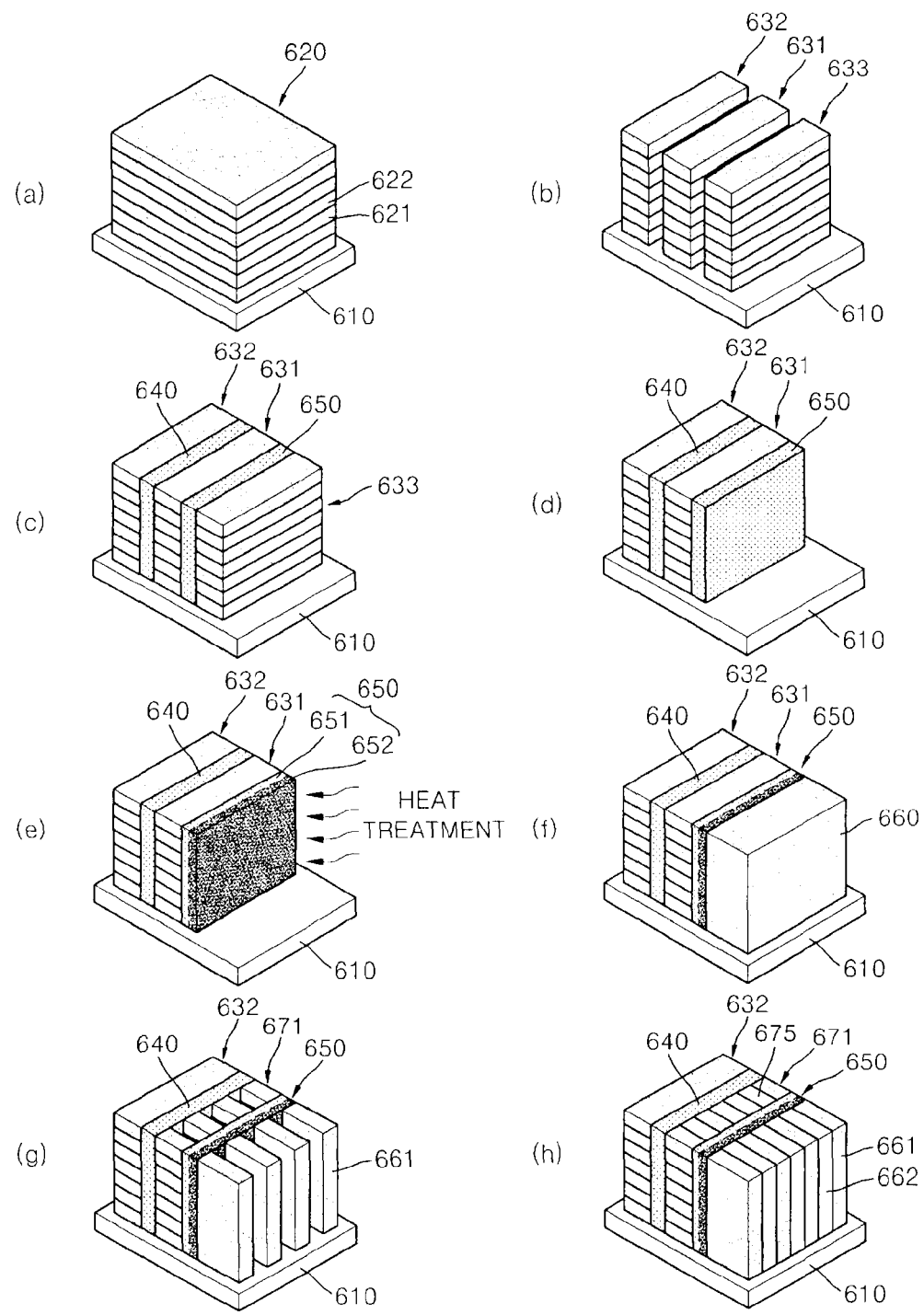
FIG. 6 is a view for explaining a method for fabricating a vertical nonvolatile memory device according to still another exemplary embodiment.

FIG. 6 is a view for explaining a method for fabricating a vertical nonvolatile memory device according to another exemplary embodiment.

Referring to FIG. 6(a), first, one or more conductive layers 621 and one or more insulating layers 622 are alternately deposited on a substrate 610 to form conductor-insulator complex layers 620.

Next, the conductor-insulator complex layers 620 are etched in their stacked direction to separate the conductor-insulator complex layers 620 into a plurality of conductor-insulator horizontal structures 631, 632, and 633 as shown in FIG. 6(b). For clarity of description, the conductor-insulator horizontal structure 631 disposed at the center of the three conductor-insulator horizontal structures 631, 632, and 633 shown in FIG. 6(b) will now be referred to as a first conductor-insulator horizontal structure 631; the conductor-insulator horizontal structure 632 disposed at the left of the first conductor-insulator horizontal structure 631 will now be referred to as a second conductor-insulator horizontal structure 632; and the conductor-insulator horizontal structure 633 disposed at the right of the first conductor-insulator horizontal structure 631 will now be referred to as a third conductor-insulator horizontal structure 633.

The processes shown in FIGS. 6(a) and 6(b) are substantially the same as those explained with reference to FIGS. 4(a) and 4(b).

Next, as shown in FIG. 6(c), a memory material is filled between the first conductor-insulator horizontal structure 631 and the second conductor-insulator horizontal structure 632 to form a memory layer 640. As explained with reference to FIG. 4(c), examples of the memory material may include a resistance change material, a phase change material, and a ferroelectric material.

Next, as shown in FIG. 6(c), an insulating member is filled in a gap between the first conductor-insulator horizontal structure 631 and the third conductor-insulator horizontal structure 633 to form a diode insulating film 650. The diode insulating film 650 may be formed of a transition metal oxide such as $TiO_2$, $NiO$, $HfO_2$, $Al_2O_3$, $ZrO_2$, $ZnO$, $Ta_2O_5$, and $Nb_2O_5$. Particularly, in the case of forming the memory layer 640 by using a resistance change material, the memory layer 640 and the diode insulating film 650 may be formed of the same transition metal oxide.

Next, as shown in FIG. 6(d), the third conductor-insulator horizontal structure 633 is removed.

Next, as shown in FIG. 6(e), a reducing process is performed to reduce a part of the diode insulating film 650 which is exposed to the outside after the third conductor-insulator horizontal structure 633 is removed. For this, a heat treatment process is performed on the diode insulating film 650 under a reducing atmosphere. To form a reducing atmosphere, the heat treatment process may be performed while supplying a mixture gas of hydrogen ($H_2$) and nitrogen ($N_2$). That is, the heat treatment process may be performed while supplying hydrogen and nitrogen to reduce a part 652 of the diode insulating film 650 while keeping the other part 651 of the diode insulating film 650 in a non-reduced state. If the diode insulating film 650 is partially reduced as described above, many traps are formed in the reduced part 652 of the diode insulating film 650 so that the diode insulating film 650 can function as a Schottky junction diode.

Next, as shown in FIG. 6(f), a vertical conductive layer 660 is formed on the position from which the third conductor-insulator horizontal structure 633 is removed.

Next, as shown in FIG. 6(g), the vertical conductive layer 660 is etched to divide the vertical conductive layer 660 into a plurality of vertical conductive films 661. That is, the vertical conductive layer 660 is divided by photolithography and dry etching methods into a plurality of vertical conductive films 661 that are arranged at regular intervals in the direction in which horizontal conductive layers of the second conductor-insulator horizontal structure 632 are extended. Next, as shown in FIG. 6(g), the first conductor-insulator horizontal structure 631 is etched to separate the first conductor-insulator horizontal structure 631 into a plurality of independent conductor-insulator structures 671. That is, the first conductor-insulator horizontal structure 631 is divided by photolithography and dry etching methods into a plurality of independent conductor-insulator structures 671 that are arranged at regular intervals in the direction in which the horizontal conductive layers of the second conductor-insulator horizontal structure 632 are extended.

Next, as shown in FIG. 6(h), an insulating material is filled in the etched parts of the vertical conductive layer 660 by a gap-filling method to form vertical insulating films 662 between the vertical conductive films 661. Next, as shown in FIG. 6(h), an insulating material is filled in the etched parts of the first conductor-insulator horizontal structure 631 by a gap-filling method to form vertical separation films 675 between the independent conductor-insulator structures 671.

The processes shown in FIGS. 6(f) through 6(h) are substantially the same as those explained with reference to FIGS. 4(e) through 4(g).

Next, outer parts of the vertical conductive films 661 and the vertical insulating films 662 are etched, and an insulating material is filled by a gap-filling method to form a protective insulating film (not shown) at the etched outer parts of the vertical conductive films 661 and the vertical insulating films 662 for separation from other devices. Details of this process are the same as those of the process explained with reference to FIG. 4(h).

In addition to the vertical nonvolatile memory device fabricating methods explained with reference to FIGS. 4 through 6, other vertical nonvolatile memory device methods may be used. For example, after performing the processes explained with reference to FIGS. 6(a) through 6(e), the processes explained with reference to FIGS. 5(e) through 5(h) may be performed to fabricate a vertical nonvolatile memory device.

According to the above-described methods, a vertical nonvolatile memory device including a selective diode can be easily fabricated because well-known deposition, etching, and heat treatment techniques, and only about three or four photolithography processes are used.

According to the present disclosure, it is possible to provide a new vertical nonvolatile memory device including a selective diode. The vertical nonvolatile memory device can be integrated more highly as compared with a nonvolatile memory device of the related art. In addition, since the vertical nonvolatile memory device includes the selective diode, reading errors can be prevented.

Although the vertical nonvolatile memory device and the vertical nonvolatile memory device fabricating method have been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:

1. A vertical nonvolatile memory device comprising:
   a substrate;
   a conductor-insulator horizontal structure disposed on the substrate, the conductor-insulator horizontal structure comprising horizontal conductive layers extending in one direction and horizontal insulating layers extending in the same direction as that in which the horizontal conductive layers extend, the horizontal conductive layers and the horizontal insulating layers being alternately stacked on the substrate along the direction which is perpendicular to the substrate;

a memory layer disposed at a side of the conductor-insulator horizontal structure and formed of a memory material;

a complex conductor-insulator structure disposed at a side of the memory layer such that the memory layer is disposed between the conductor-insulator horizontal structure and the complex conductor-insulator structure, the complex conductor-insulator structure comprising independent conductor-insulator structures and vertical separation films that are alternately arranged on the substrate in the direction in which the horizontal conductive layers extend, each of the independent conductor-insulator structures comprising independent conductive layers and independent insulating layers that are alternately stacked on the substrate along the direction which is perpendicular to the substrate;

a selective diode disposed at a side of the complex conductor-insulator structure such that the complex conductor-insulator structure is disposed between the memory layer and the selective diode; and a conductor-insulator vertical structure disposed at a side of the selective diode such that the selective diode is disposed between the complex conductor-insulator structure and the conductor-insulator vertical structure, the conductor-insulator vertical structure comprising vertical conductive films and vertical insulating films that are disposed on the substrate, the vertical conductive films and the vertical insulating films being alternately arranged in the direction in which the horizontal conductive layers extend.

2. The vertical nonvolatile memory device of claim 1, wherein the number of the horizontal conductive layers of the conductor-insulator horizontal structure is equal to the number of the independent conductive layers of each of the independent conductor-insulator structures, and the number of the independent conductor-insulator structures of the complex conductor-insulator structure is equal to the number of the vertical conductive films of the conductor-insulator vertical structure.

3. The vertical nonvolatile memory device of claim 2, wherein the conductor-insulator horizontal structure is formed by alternately stacking the horizontal conductive layers and the horizontal insulating layers, and each of the independent conductor-insulator structures is formed by alternately stacking the independent conductive layers and the independent insulating layers, wherein the horizontal conductive layers and the insulating conductive layers that face each other with the memory layer being disposed therebetween have the same thickness, and the horizontal insulating layers and the independent insulating layers that face each other with the memory layer being disposed therebetween have the same thickness.

4. The vertical nonvolatile memory device of claim 2, wherein the independent conductor-insulator structures and the vertical conductive films are arranged to face each other with the selective diode being disposed therebetween, and the independent conductor-insulator structures and the vertical conductive films have the same length in the direction in which the horizontal conductive layers extend, and vertical insulating films and the vertical separation films have the same length in the direction in which the horizontal conductive layers extend.

5. The vertical nonvolatile memory device of claim 1, wherein the selective diode is a p-n diode.

6. The vertical nonvolatile memory device of claim 1, wherein the selective diode is a Schottky junction diode comprising:

a semiconductor layer formed of a semiconductor material and disposed at the side of the complex conductor-insulator structure in a manner such that the semiconductor layer makes Schottky contact with the independent conductive layers of the complex conductor-insulator structure; and an ohmic contact layer formed of a conductive material and disposed between the semiconductor layer and the conductor-insulator vertical structure, the ohmic contact layer making ohmic contact with the semiconductor layer.

7. The vertical nonvolatile memory device of claim 1, wherein the memory layer is formed of one of a resistance change material having a resistance varying according to an electric signal, a phase change material that varies in phase according to an electric signal, and a ferroelectric material having a remanent polarization varying according to an electric signal.

8. The vertical nonvolatile memory device of claim 1, wherein the memory layer is formed of a transition metal oxide, and the selective diode is formed of a partially reduced transition metal oxide.

9. The vertical nonvolatile memory device of claim 1, further comprising a protective insulating film disposed at a side of the conductor-insulator vertical structure such that the conductor-insulator vertical structure is disposed between the selective diode and the protective insulating film.

* * * * *